United States Patent [19]

Cuomo et al.

[11] Patent Number: 4,588,490

[45] Date of Patent: May 13, 1986

[54] HOLLOW CATHODE ENHANCED MAGNETRON SPUTTER DEVICE

[75] Inventors: Jerome J. Cuomo, Lake Lincolndale, N.Y.; Harold R. Kaufman, Fort Collins, Colo.; Stephen M. Rossnagel, White Plains, N.Y.

[73] Assignee: International Business Machines Corporation, Armonk, N.Y.

[21] Appl. No.: 736,918

[22] Filed: May 22, 1985

[51] Int. Cl.$^4$ .............................................. C23C 15/00
[52] U.S. Cl. ................................ 204/298; 204/192 R; 204/192 E; 156/354; 156/643
[58] Field of Search ............................ 204/298, 192 E; 156/345, 643

[56] References Cited

U.S. PATENT DOCUMENTS

| | | | |
|---|---|---|---|
| 4,407,712 | 10/1983 | Henshaw | 204/298 |
| 4,431,473 | 2/1984 | Okano et al. | 204/298 |
| 4,521,286 | 6/1985 | Horwitz | 204/298 |

OTHER PUBLICATIONS

Horwitz App. Phy. Letters 44(11) Jun., 1984, pp. 1041–1044.
Horwitz App. Phys. Lett. 43(10) Nov. 1983, pp. 971–979.
thornton et al. J. Vac. Sci Tech. 12 (1975) pp. 93–96.

Primary Examiner—Arthur P. Demers
Attorney, Agent, or Firm—Roy R. Schlemmer

[57] ABSTRACT

A plasma sputter etching/deposition system comprising an electron-emitting hollow cathode arc-source combined with a conventional plasma sputter etching/deposition system such as a magnetron. The electrons emitted are coupled into the intrinsic high energy, e.g., magnetic field and are accelerated by the plasma potential and cause a significant increase plasma density. The resultant combination allows much greater sputtering-/deposition efficiency than was possible with previous devices. According to a further aspect of the invention, switched operation is possible, whereby etching may vary from isotropic to anisotropic. A side discharge hollow cathode structure is also described for enhancing certain sputtering/deposition processes, wherein electrons may be emitted from one or more openings at the side of a hollow cathode chamber to achieve more uniform electron emission in a large process chamber.

17 Claims, 7 Drawing Figures

HOLLOW CATHODE ENHANCED MAGNETRON SPUTTER DEVICE

BACKGROUND OF THE INVENTION

Plasma sputter etching/deposition systems have long been used in the electronics industry for fabricating various sophisticated items such as LSI and VLSI circuits, memories, magnetic read/record heads, etc. The systems may characteristically be used for the deposition of material onto a target (sputter deposition) or for the selective removal (etching) of material from such a target. The material removal processes remove material by ion or electron bombardment or by reactive ion etching. Typical plasma systems are RF sputtering, magnetron sputtering, diode (DC) sputtering, ion beam sputtering, ion plating, etc. As with any industrial process, any modifications which make the process more efficient either in terms of time or expense greatly improves the value of the process.

The following description of the present invention is directed primarily toward high plasma density magnetron sputter etching/deposition systems, however it is to be understood that the concepts disclosed have broader applicability.

A magnetron sputtering system is basically a diode plasma device with a strong magnetic enhancement at the cathode. This magnetic enhancement serves to form an electron trap, such that electrons undergo ExB drifting paths which close upon themselves. The strong magnetic fields present also increase the electron ionization probability and the plasma density, leading to high ion bombardment rates of the cathode and high sputtering rates. Two basic types of magnetrons have been developed which are: the cylindrical post magnetron, and the planar magnetron.

A magnetron sputtering device may be characterized by two equations. The first, by J. A. Thornton, J. Vac. Sci & Technology, Vol. 15 (1978) pp 171, relates the lowest operating voltage, V, to the average energy required for the production of an electron-ion pair, E:

$$V = E/\gamma e_1 e_2 \quad (1)$$

where $\gamma$ is the secondary electron coefficient for ion bombardment (of the cathode), $e_1$ is the probability that an ion will hit the cathode, and $e_2$ is the probability that a secondary electron will totally utilize its energy in ionization. The second relevant equation is the empirical relation $$i = k V^n \quad (2)$$

where V is the operating voltage, i is the magnetron current and n is an exponent in the range of 3-10. Higher values of n indicate more efficient magnetron operation, a value of 5-7 being an average value.

The first equation predicts minimum or turn-on magnetron voltages of over 300-350 volts. Voltages in this range are indeed found experimentally, although the magnetron currents at those energies are quite small and the sputtering and deposition rates low. A typical magnetron sputtering system operates in the 400-600 volt range at currents of a few amps, and up to 20 amps in very large systems (Op Cit., Thornton). The operating pressures of a magnetron device are in the 3-10 millitorr range. At constant power, an increase in the pressure will result in an increase in the magnetron current and a decrease in the operating voltage. At high pressures, though, scattering of the sputtered material becomes even more significant and the actual deposition rate will decrease.

There are several drawbacks with magnetron devices. The first is the operating pressure, which is by necessity in the 3-10 millitorr range. At these pressures, the mean-free path of a sputtered atom is only a centimeter or less. This short length means that sputtered material is often scattered prior to deposition on a substrate. Typically only 35% of the total material removed from the target is deposited on the substrate area, the remaining 65% coat the various parts of the system, as well as being redeposited on the target as shown in (W. H. Class, "Thin Solid Films," Vol. 107, (1983), p 379). This scattering also limits the effective target-to-substrate distance to a few centimeters, which can result in significant substrate electron and ion fluxes. The scattering also results in a loss of directionality of the depositing flux, which makes such processes as "lift-off" more difficult. The second severe operating problem with magnetrons is the high energies necessary for operation. Typical energies of 400–600 eV are needed for useful sputtering rates. These high energies can cause significant target damage, or substrate damage in the case of samples being the sputtering target. To increase the deposition or sputtering rates, it is necessary to increase the magnetron voltage. As the electron energy increases, the ionization probability near the target surface decreases, and the discharge becomes more inefficient. The high energies can induce or inhibit various chemical reactions at the target surface, which may not necessarily be desired. The magnetron sputtering system is restricted by equation (1) to only operating at high voltage, and only with the current/voltage characteristic described by equation (2).

A hollow cathode is a plasma device which is capable of emitting a high electron current. The actual operating procedure is well known and has been described in detail in the (H. R. Kaufman, R. S. Robinson and D. C. Trock, "J. Spacecrafts and Rockets," Vol. 20, (1983), p 77), and will not be repeated here. By biasing the hollow cathode sufficiently negative of some anode, a plasma can be produced due to electron ionization of the background (working) gas. This plasma is characterized by a discharge current, which is also equal to the emission current of the hollow cathode. With even a small hollow cathode of diameter ⅛ inch, discharge currents of up to 15 amps are possible at pressures in the 0.2–0.6 millitorr range in Argon.

The hollow cathode effect per se has been described in great detail in the following three references, as well as quite a few others, and will not be described in detail here:

1. H. R. Kaufman, R. S. Robinson and D. C. Trock, J. Spacecrafts and Rockets, Vol. 20 (1983) p. 77.
2. H. R. Kaufman, in "Advances in Electronics and Electron Physics," Vol. 36, *Academic Press, NY*, (1974), p. 265.
3. J. L. Delcroix and A. R. Trindade, in "Advances in Electronics and Electron Physics," Vol. 35, *Academic Press, NY*, (1974), p. 87.

In the past, hollow cathodes have only been reported which are based on a cylindrical geometry, i.e., based on a tube, which is usually a refractory material such as tantalum. The tube often has a constriction at its tip, which serves to increase the internal pressure of the cathode. Usually, an insert of foil or other material is added near the tip. Gas is incident on the cathode from an external supply, which due to the smallness of the aperture causes pressures of up to a Torr inside the tube. A plasma discharge can be generated by biasing a keeper or anode, positive with respect to the cathode. This plasma will exist in a region which is inside the hollow cathode, which will be at much higher pressure and hence have a much greater plasma density than those values outside of the hollow cathode. The ion bombardment of the foil inside the tip, which is insulated by the outer layers of foil, will cause the inner layers of the foil to become quite hot, often 2000 K. At this high temperature, the foil surface can thermionically emit electrons, which causes a greater generation of plasma. Once this increase in plasma density occurs, the relative potential of the keeper or anode with respect to the hollow cathode can be reduced to voltages in the 30–50 volt range.

Multiple hollow cathodes of a sort have also been developed. The cathodes consist of a number of tubes tightly bound together in an outer tube, sharing a common gas and electrical power supply. The multiple tubes serve to restrict the gas conduction through the tubes, allowing for higher current operation at reduced gas flow. These multiple cathodes, however, do not really depart from the above described mode of operation, and are also restricted to the basic cylindrical geometry.

The ability to radically change the geometry of operation is necessary, however, for a number of specialized applications, such as electron injection into magnetron and other high energy plasmas or other large chambers. In addition, the operation of multiple, separated but coupled hollow cathodes is not possible with the classical design, due to gas flow considerations and coupling problems with power supplies.

PRIOR ART

U.S. Pat. No. 4,431,473 discloses an RF magnetron device which can be used for reactive ion etching. Special provision has been made to have several chambers for the discharge, the magnet assembly, gas inlet, etc. The present invention differs significantly from the patent in that a hollow cathode electron source is used to inject energetic electrons into an existing magnetron plasma. There is no source of electrons (other than the normal cathode secondaries) in U.S. Pat. No. 4,431,473.

The present invention operates at low pressures, as low as $4 \times 10(-5)$ Torr, significantly below the range of a conventional magnetron (1 millitorr). The device in U.S. Pat. No. 4,431,473 operates in the 10 millitorr range. The low pressure of operation of the present invention allows line-of-sight processes, as well as multiple plasma processes within the same chamber. Also the present invention will operate in either RF or DC modes. U.S. Pat. No. 4,431,473 is only an RF device.

The present invention also operates in either a sputtering mode, for sputtering of the cathode or sputter deposition of cathode material onto a sample, or in an Reactive Ion Etching (RIE) or Reactive Deposition mode, where some chemical reaction is taking place at the cathode surface. U.S. Pat. No. 4,431,473 is only a RIE device, for etching of a sample on the cathode surface.

Finally, the present invention operates at voltages of 20 eV or lower, because the plasma is sustained by the hollow cathode emission. U.S. Pat. No. 4,431,473 has no provision for low energy operation, other than that obtained from the addition of a magnetic field to an RF diode. This limits low voltage operation still to 300–400 volts at the minimum.

An article by C. Horwitz, Applied Physics Letters, Vol. 44 (1984), pp 1041, describes the reactive ion etching of materials in a modified RF device. The device has been configured to form a partial electrostatic hollow cathode glow, which changes the etching and polymerization rates in an oxygen/freon plasma. The article makes no mention of magnetron sputtering in any fashion and makes no mention of the injection of electrons into a magnetron or RF plasma from an auxiliary electron source (hollow cathode arc).

SUMMARY OF THE INVENTION

The present invention combines a hollow cathode electron emitting device in a specific manner with an existing plasma sputter etching/deposition device. In particular, the hollow cathode device has been combined with a magnetron sputter etching/deposition system with surprising results. The hollow cathode is utilized to provide additional ionization of the working gas during normal magnetron operation, and provides all the gas ionization at low magnetron energies. Low energy magnetron operation of this type was not previously possible. At the high magnetron voltages (i.e., normal operation) the hollow cathode has been found to increase the magnetron current in the deposition mode by at least a factor of 10 times.

It has further been found that by successively operating the combined system at low magnetron energy and high magnetron energy, it is possible to switch from a sputtering to a sub-sputtering mode with attendant isotropic and anisotropic etching, respectively. Utilizing this concept unique results have been obtained with regard to controlling etch profiles.

According to a further aspect of the invention, side discharge hollow cathodes and multiple side discharge hollow cathodes have been developed which depart from previous hollow cathode designs and which have particular utility with the combined hollow cathode plasma sputter etching/deposition systems of the present invention. These cathodes rather than relying on specialized tips at the ends of the hollow cathode tube, rely on apertures in the sides of a closed tube as the electron emission point. It has further been possible to generalize the geometry of the hollow cathode effect to non-cylindrical shapes which not only simplify cathode construction, but also suits them better for use in specialized plasma systems such as magnetrons.

OBJECTS OF THE INVENTION

It is a primary object of the present invention to provide an improved high energy plasma sputter etching-/deposition system.

It is another object of the invention to provide such a system which combines a hollow cathode electron source with a high energy plasma system.

It is still a further object to provide such a system wherein the particular high energy plasma device is a magnetron sputter etching/deposition system.

It is another object of the invention to provide such a combined system capable of operation at lower pressures and lower energy levels with high plasma density where desirable.

It is another object of the invention to provide such a combined system capable of much higher sputtering rates than would normally be possible without the hollow cathode enhancement.

It is another object of the invention to provide such a combined system capable of performing different types of etching processes by merely switching the current/voltage characteristics at a constant power level.

It is yet another object of the invention to provide such a switched operating mode wherein the system will perform selectively isotropic or anisotropic etching.

It is a further object of the invention to provide a novel hollow cathode configuration for use in such combined systems providing improved electron current distribution within a reaction chamber.

It is another object to provide such a hollow cathode configuration utilizing emission from the side of the hollow cathode rather than axially therefrom.

Other objects, features and advantages of the present invention will be apparent from the subsequent description of the preferred embodiments thereof.

DESCRIPTION OF THE PREFERRED EMBODIMENT

Figure 1:
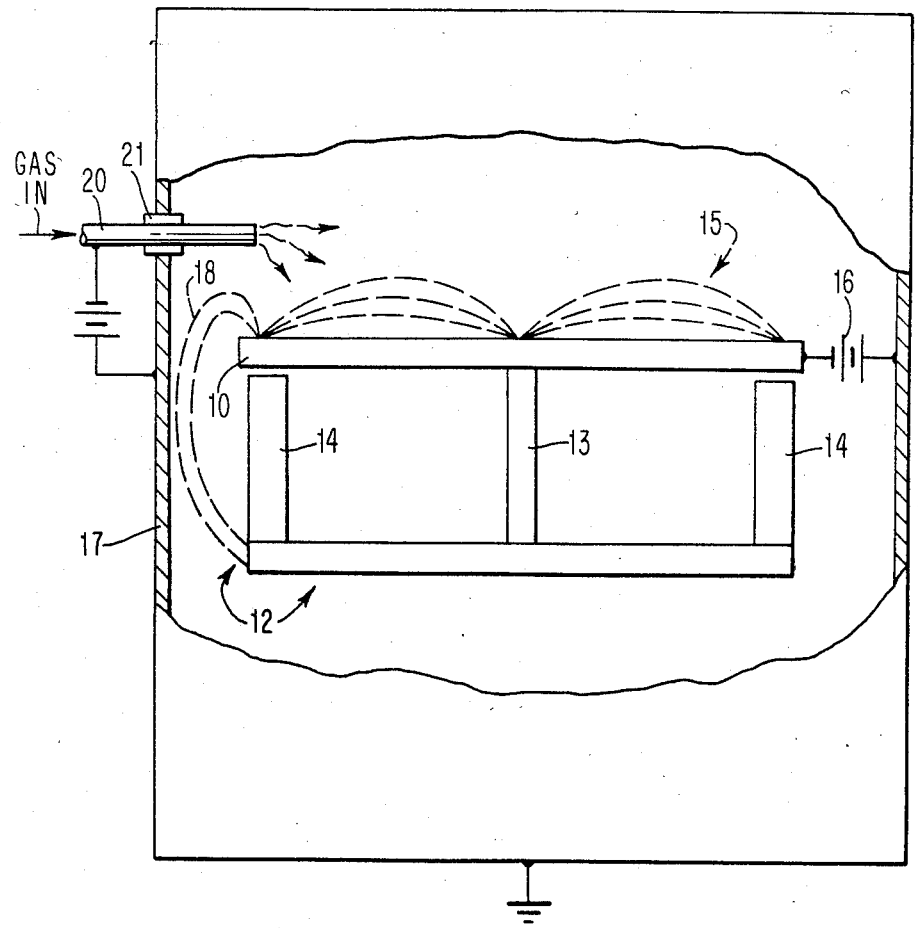
FIG. 1 comprises a cross sectional view of a simplified hollow cathode enhanced magnetron sputter etching/deposition system embodying the principles of the present invention.

The magnetic configuration of a planar magnetron is shown in cross section in FIG. 1. In this figure, the magnetron target 10 is placed on a magnet assembly 12, which consists of a central pole 13 of one magnetic polarity, and a circular outer pole 14 of the opposite polarity. Magnetic field lines 15 are shown connecting the two poles. The strength of the magnetic field is related to the density of these virtual field lines 15. The magnetron target 10 is biased by up to several hundred volts negative by the magnetron power supply 16. In this embodiment the chamber 17 functions as the anode, although often a separate anode closer to the magnetron target 10 is present. The chamber 17 also functions as the vacuum enclosure.

Figure 2:
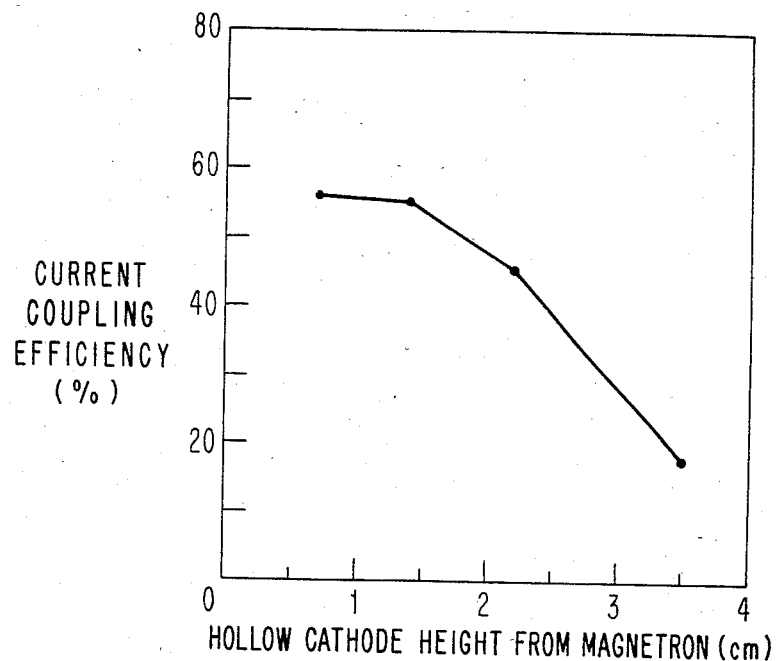
FIG. 2 comprises a graph illustrating the coupling efficiency of the hollow cathode emission current into the magnetron device.

A critical aspect of the invention is the coupling between the hollow cathode plasma and the magnetron plasma. This coupling of the two devices depends critically on the positioning of the hollow cathode or multiple cathodes. One example of this positioning is shown in FIG. 1 for a planar magnetron. In this case, the hollow cathode 20 and keeper assembly 21 are mounted above the magnetron target 10, close to the outer edge, and projecting horizontally in towards the magnetron center. The radial position of the hollow cathode 20 must be such that the magnetic field lines that it intersects travel to the center pole 13, rather than the bottom of the magnetic assembly, as field lines 18 do. The vertical positioning of the cathode at this radial position (as shown in FIG. 1) will determine the strength of the magnetic field at the cathode and the coupling efficiency of the cathode to the magnetron plasma. This coupling efficiency can be measured at constant magnetron voltage and pressure as a percentage of the hollow cathode discharge current which is incident on the magnetron target. A chart of this coupling efficiency is shown in FIG. 2.

The configuration shown in FIG. 1 is not the only position at which the hollow cathode plasma will couple into the magnetron plasma. The hollow cathode can be placed vertically at the same radial position, or else closer to the target center. This can be extended to the extreme that the hollow cathode can be placed vertically over the center of the target 10. The primary constraint is that the field lines that the hollow cathode intersect are ones which traverse the front of the target (shown in FIG. 1 as 15). There is, however, a point at which the hollow cathode can be mounted too close to the magnetron target 10. This occurs when the hollow cathode is mounted closer than 2-3 Larmor radii from the target surface in the area between the center pole piece 13 and the outer pole piece 14. A Larmor radius in this case is a few millimeters. When the hollow cathode is in this position it physically impairs the magnetron ExB drift current. This results in very poor magnetron operation, characterized by much higher operating voltages and low deposition rates. The positioning criteria for the planar circular magnetron and the rectangular planar magnetron will be quite similar. For other magnetron geometries, such as the cylindrical or cylindrical post magnetron, the physical positioning of the hollow cathode in the magnetron will by necessity be different. However, the two main criteria remain: the hollow cathode must be immersed in the transverse magnetic field at the magnetron cathode surface, and the hollow cathode must not be an electrical or physical impediment of the magnetron ExB drift current.

Figure 3:
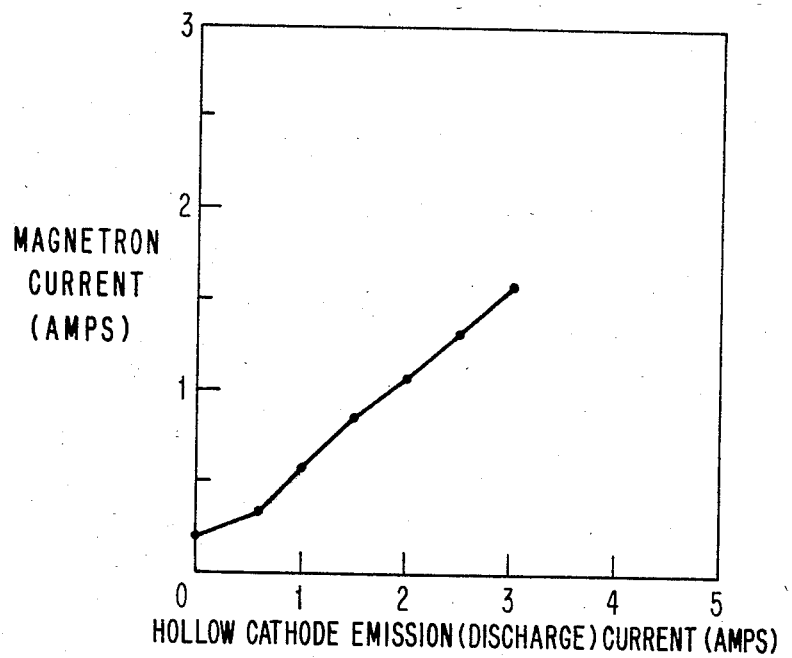
FIG. 3 comprises a graph illustrating the current relationships in a constant voltage magnetron with a hollow cathode enhancement.
Figure 4:
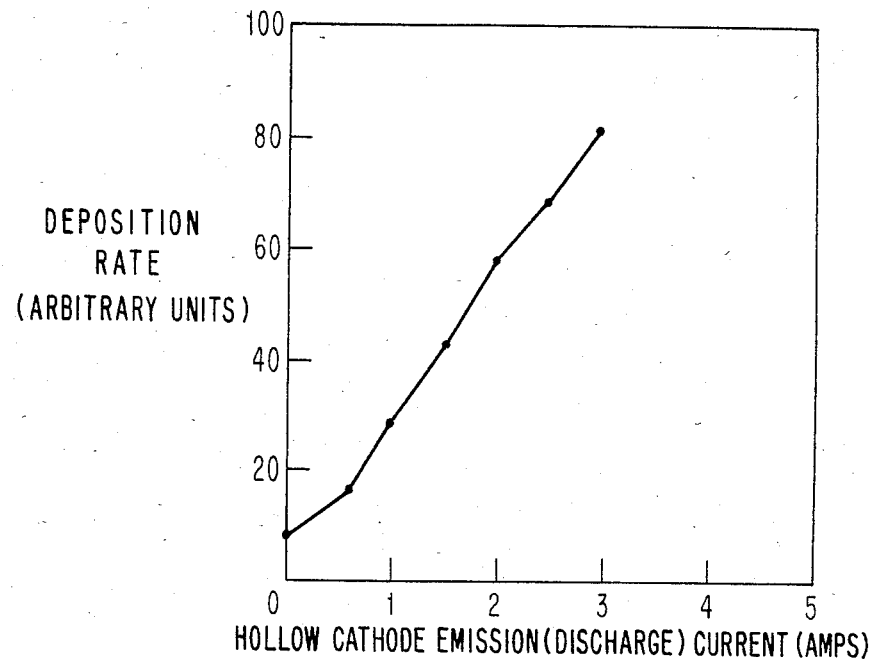
FIG. 4 comprises a graph showing the relationship between the deposition on a target/hollow cathode emission current for a constant voltage magnetron with a hollow cathode enhancement constructed in accordance with the present invention.

The current-voltage characteristics of a magnetron at constant pressure have been found to follow equation (2) above. Thus any increase in magnetron current necessitates an increase in the magnetron voltage. With hollow cathode enhancement of the magnetron, however, this is not the case. For a configuration similar to FIG. 1, the magnetron voltage can be held constant as the hollow cathode emission is increased. The increase in the hollow cathode emission causes additional ionization of the gas in the magnetron vicinity and increased magnetron current. A plot of this behavior is shown in FIG. 3 for a constant magnetron voltage and gas pressure. As can be seen from the figure, the magnetron current can be increased almost a factor of 10 times by the addition of 3 amps of hollow cathode discharge current. Measurements of the deposition rate on an external crystal ratemonitor document a comparable increase in the deposition rate of sputtered target material. (See FIG. 4.) The coupling coefficient, as described above, is in this case approximately 46%, which means 46% of the emitted hollow cathode discharge current is incident on the magnetron target to produce enhanced sputtering.

A second feature of this enhanced operation is the low pressure of operation. A prior art magnetron operates typically at gas pressures (in Argon) of 3–10 millitorr. The enhanced operation described here operates at comparable or higher magnetron currents but at pressures a factor of ten lower, in the 0.3–0.5 millitorr range. This lower pressure is accompanied by a much longer mean free path for the sputtered material, which means that a higher percentage of target material is likely to land on the substrate or conversely, that material sputtered from the target (which may be the sample) is quite unlikely to redeposit on the target. More importantly, operation at these lower pressures means that the sputtered material travels in essentially a straight line path, as does evaporated material.

The ability to operate at these low pressures allows the capability to separate the sputtering target from the sample substrates by a significant distance. Prior art magnetron sputtering systems typically have a target to substrate distance of only a few centimeters, due to the high scattering of the sputtered material. Additionally, the lower pressure of operation allows other processes to occur simultaneously. For example, evaporation techniques which will not operate in the pressure environment of a prior art magnetron will operate well in the pressure range of the hollow cathode enhanced magnetron. Additional processes, such as ion beam bombardment or sputter deposition, ion plating or other ion, electron or photon bombardments of the target or substrate surfaces are possible due to the separation of the target and the substrate and the low pressure operation capability.

Unlike prior art magnetrons which have a turn-on voltages of over −300 volts, the hollow cathode enhanced magnetron operates at any energy down to the floating potential, which in this case is in the −15 to −20 volt range or less. This feature is due to the presence of the hollow cathode induced plasma, which is independent of the magnetron potential. With the vacuum chamber at ground potential and functioning as the anode, a plasma can be induced by biasing the hollow cathode at least 30 volts negative. The plasma potential of the plasma in the magnetron vicinity will be close to and slightly above ground. Alternatively, a separate anode can be biased positively of ground by an equivalent voltage. This also gives sufficient energy to the hollow cathode electrons to induce a plasma, but in this case the plasma potential will be close to and slightly above the anode potential. This latter case will increase the energy of the bombarding ions somewhat to the magnetron target surface.

Figure 5:
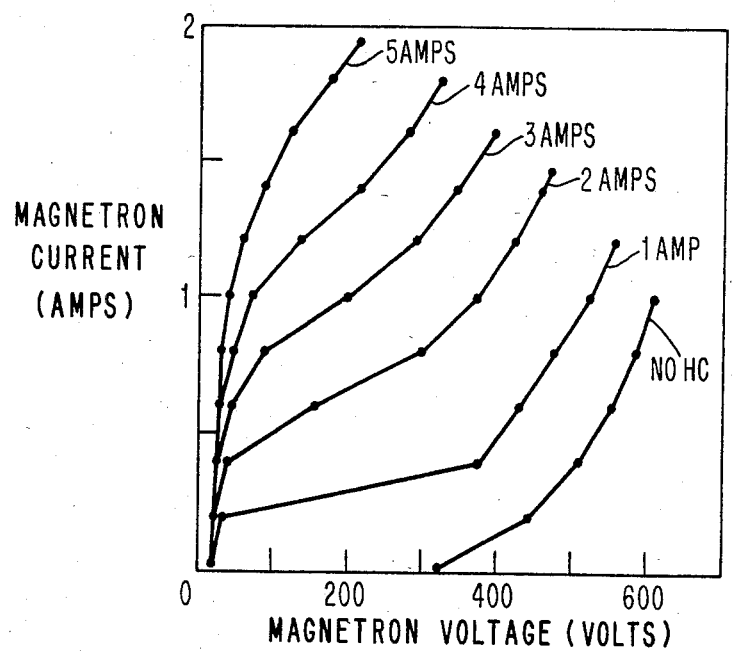
FIG. 5 shows a series of curves showing the relationship between magnetron current to magnetron voltage for a number of different emission intensities for the hollow cathode.

With the hollow cathode induced plasma established, biasing the magnetron target negative (from anode potential) will induce bombardment of the cathode surface at an energy equal to the sum of the magnetron potential plus the plasma potential. A plot of the resultant magnetron current and voltage as a function of hollow cathode discharge current (emission current) is shown in FIG. 5. The most visible feature is the dramatic shift to low ion energies at significant magnetron currents, due to the hollow cathode emission current. Without any hollow cathode current, the magnetron is incapable of operating at voltages (ion energies) below 300 volts (300 eV). The magnetron is then restricted to operating only at the voltages and currents defined by the far right-hand curve in FIG. 5. Stated differently, this would be its operating characteristic if there were no hollow cathode present. With sufficient hollow cathode emission current relatively high current operation (>1 amp) is possible at energies below 100 eV. It should be noted that a magnetron current of 1 amp for the present magnetron system corresponds to an ion current density of 7 mA/cm$^2$.

At least three processes can be strongly enhanced by this high current density low energy bombardment of the target. These processes are: (1) "co-sputtering" or concurrent sample ion bombardment during a film deposition, (2) reactive ion etching of the target surface, leading to very high chemical etch rates, and (3) induced chemical reactions in a depositing film. Each of these areas will be described below.

The ability to bombard films as they are growing with low energy ions has been shown to strongly affect the film properties in (J. M. E. Harper, J. J. Cuomo, R. J. Gambino and H. R. Kaufman, "10 V Bombardment Modification of Surfaces," ed. by R. Kelly and O. Anciello (Elsevier, Amsterdam, (1981). For example, the stress or adhesion of the film can be adjusted by the ion bombardment to more favorable values. The energy of the ion bombardment, however, must be sufficiently low as to not sputter off the film at high current densities. The hollow cathode enhanced magnetron can produce very high current densities on the target, or samples placed on the target, at energies below the sputter threshold for the depositing film. Thus, there is no possibility of sputtering off the depositing film. Because the bombarding current densities can be quite high, this co-sputtering process can occur at quite high rates of film deposition.

Reactive Ion Etching

As described above, the hollow cathode enhanced magnetron device is capable of quite high bombarding ion current densities to the target, or samples on the target, at energies below the sputter threshold of the film species. This feature becomes important for the purposes of reactive ion etching. As an example of a reactive ion etching process, an ion of a reactive species (such as oxygen or freon) is directed to a sample surface. At the surface a chemical reaction occurs with the surface material, resulting in a volatile compound which leaves the surface and can be pumped away. Reactive ion etching is an isotropic, dry etching process. However, if the incident ion bombards the surface with energy above the sputter threshold, physical sputtering is also likely to occur. Therefore, for the purposes of reactive ion etching, the hollow cathode enhanced magnetron is an appropriate device for high rate reactive ion etching without sputtering as it can operate at high current densities at energies below the sputter threshold.

Chemical Reactions In Depositing Films

The high current, low energy ion bombardment of the target surface in the hollow cathode enhanced magnetron is also quite useful for inducing chemical reactions in depositing films.

One example is nitride formation. A depositing film of aluminum in a nitrogen background pressure will not form aluminum nitride as discussed in J. M. E. Harper, J. J. Cuomo and H. T. G. Hentzell, Appl. Phys. Letter, 43, (1983) p 547. It is necessary to bombard the aluminum film with energetic nitrogen to induce the reaction to occur. The enhanced magnetron can be used to provide high current density nitrogen bombardment in this case to a depositing film at ion energies below the sputter threshold, as to not remove any of the film. Thus, very high rate compound film formation can occur by inducing chemical reactions at the target surface of the enhanced magnetron.

Switched Magnetron Operation

As described previously, magnetrons are magnetically enhanced diode sputtering systems. They have been utilized either for the purposes of depositing cathode material on other substrates by sputter deposition, or for etching of samples on the cathode itself. It is the latter feature which is of interest here. This etching process is an anisotropic etch, i.e., the ions bombard the surface of the sample on the cathode (and the cathode itself) at normal incidence. This causes sputtering, which will produce vertical sidewalls when used in conjunction with a mask.

A second unique feature of such enhanced magnetron plasma devices is reactive ion etching described above. In reactive ion etching, very low energy ions of a reactive species (such as oxygen, freon or $CCl_4$, for example) are directed at a surface in a low energy gas discharge. These reactive ions then react chemically with the atoms at the surface of the cathode, forming a volatile species which leaves the surface and is pumped away. This process is an isotropic etching process. This feature is due to the low ion energy of the reactive ions (typically a few up to 10-20 eV) and the chemical nature of the etching process. The isotropic process results in substantial undercutting of the substrate when used with a mask.

The hollow cathode enhanced magnetron system of the present invention emits large numbers of electrons, which enhance the plasma in the magnetron vicinity, and can lead to substantial increases in the magnetron current, sputtering and deposition rates. A more subtle feature of the operation of this invention will now be described. Referring again to FIG. 5, the magnetron current and voltages are plotted as a function of hollow cathode emission current in the hollow cathode enhanced magnetron system. As can be seen in the figure, the curve at the far right is the operation of the magnetron with no hollow cathode emission current. By increasing the hollow cathode emission, the curve moves successively to lower energy while keeping a relatively high magnetron current. For example, if a horizontal line is drawn on the figure at 1.0 amps of magnetron current, the energy of ion bombardment (magnetron voltage) can be varied from 600 eV with no hollow cathode current to 40 eV at 5.0 amps of hollow cathode emission. This energy is below the sputter threshold for most materials. However, the ion bombardment current, and hence the ion current density, is not varied. Thus, by varying the amount of hollow cathode emission current in the hollow cathode enhanced magnetron, the ion bombardment of the cathode or samples on the cathode can be changed from a sputtering energy (600 eV) to a sub-sputtering energy of approximately (40 eV).

The low energy energy bombardment is in the range of energies necessary for reactive ion etching. By increasing the hollow cathode current higher, this bombardment energy can be dropped further to less then 20 eV.

The invention utilizes the ability to dramatically change the energy of the ion bombardment at the cathode surface to switch between a sputtering bombardment, or anisotropic etch, to a non sputtering, reactive bombardment, or isotropic etch. The gas, in this case, would be the same for both processes. For example, oxygen bombardment at 600 eV will do primarily sputtering, which is anisotropic, even though the oxygen is somewhat reactive. At the sub-sputtering energy present due to high hollow cathode electron emission, the effect of the oxygen will be only reactive, which is isotropic. The ability to switch from one type of bombardment to another will be limited in rate only by the power supplies which drive the magnetron and the hollow cathode emission. These supplies can be run in a DC mode, manually switching from one mode to another, or can be electronically switched at frequencies up to ten of kilohertz or more.

The primary utility for the herein described switched magnetron operation would be for the production of sloping sidewalls in samples etched on the cathode surface. By switching between anisotropic and isotropic etching at these high bombardment rates (tens of milliamps per square centimeter), the slope of a sidewall cut below a mask can be controlled, or tapered accordingly.

This switching process has the additional advantage of occurring at much lower pressure than normal magnetron operation, or normal reactive ion etching operation. A magnetron typically operates at 5-10 millitorr, reactive ion etching occurs at 30-100 millitorr. The invention described here, utilizing the hollow cathode enhanced magnetron system in a switching mode, operates at high current densities of >10 milliamps per square centimeter at pressures less than 1 millitorr range. This lower pressure reduces the amount of reactive gas in the system and the loading on the pumps, as well as reduces the problem of exhausting potentially hazardous gases from the pumps. The lower pressures allow also line-of-sight processes, as well as multiple processes, as described in the earlier disclosure.

Special Hollow Cathode Configurations

As stated previously, the presently disclosed hollow cathode enhanced magnetron sputter etching/deposition system makes a great many processes possible which were not possible with the simple (non enhanced) magnetron system. The simple cylindrical hollow cathode having an axial electron emitting orifice at one end is often difficult to place in a reaction chamber. And the single source of electrons is often inadequate to enhance an otherwise feasible process. This problem gave birth to the side (discharge) hollow cathode.

Figure 6:
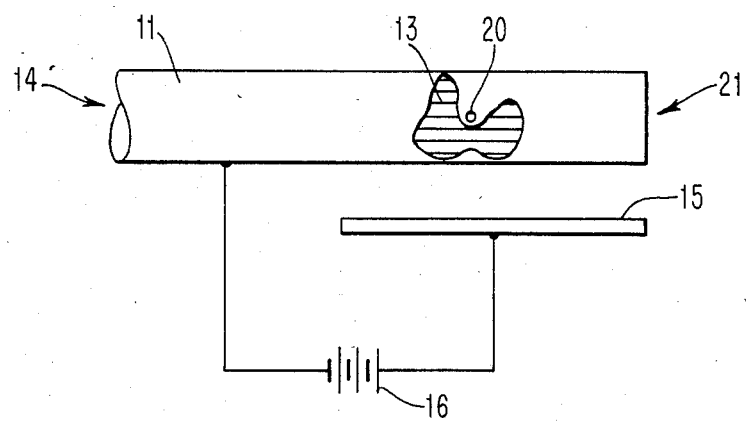
FIG. 6 comprises a side view partially in section illustrating a side discharge hollow cathode which may be utilized with the overall combination of the present invention.

The side hollow cathode utilizes many of the features of the classical cylindrical hollow cathode. A drawing of a side hollow cathode is shown in FIG. 6.

The side hollow cathode is based on the same refractory metal tube 11 as described previously above. Instead of a specialized tip assembly, a small aperture 20 is drilled in the side of the tube 11. The end of the tube 21 may be sealed off, or it may be continued to other side cathodes, to be described below. Gas 14 flows into the tube from the left end, although it could also be incident from the right, sealed off side 21. Again, rolled foil 13, which is also refractory is placed inside the cathode below the hole.

Operation of the side hollow cathode is much the same as described above for the classical cylindrical hollow cathode, and will not be repeated here. Devices of this type operate at much the same levels as prior art cathodes, both in gas flow, and discharge current and voltage.

Figure 7:
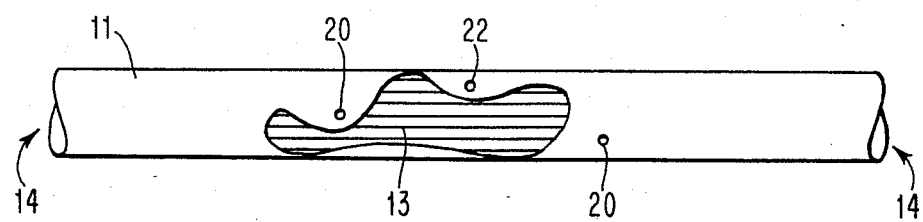
FIG. 7 comprises a side view partly in section of a further embodiment of a side discharge hollow cathode having a pluarity of discharge points for achieving even greater cathode current density.

A straightforward elaboration of this side hollow cathode is to simply continue the tube and add a second or more apertures. This is shown in FIG. 7. The additional apertures, labeled 22, 23, etc., can either share the same foil insert 13 or have additional separate inserts. An equivalent modification would be to have apertures on opposite sides of the tube, either at the same or different locations. In each case, the hollow cathode effect is unchanged. However, it should be understood that these are only exemplary of the possibilities using this similar side cathode geometry.

Operation of the multiple aperture side cathode is essentially unchanged from the above described single aperture side hollow cathode. There is some difficulty at low currents in attaining discharges at each aperture. This effect is due simply to lack of sufficient bombarding ion current to heat each of the foils below the apertures. This problem is eliminated simply by increasing the discharge (or emission) current. In practice, it is sufficient to have a keeper or anode located only over one of the apertures in a multiple side cathode. The other apertures may then gain enough heat by lateral conduction along the tube to initiate local discharges. An alternative is to have one long keeper or anode which encompasses all of the apertures. This may not be possible in all environments. A second alternative would be to have a moving keeper or anode, which moved along a row or array of apertures, igniting each aperture in turn.

Single side hollow cathodes and multiple side hollow cathodes have a number of desirable advantages over the conventional cylindrical hollow cathode. These features are application oriented and include such applications as electron bombardment ion sources, glow discharge plasma initiation and plasma enhancement in devices such as magnetrons. In an ion source, the ability to have multiple electron sources with a single power supply and gas source greatly simplifies operation in large ion sources. Typically in a large ion source, the electron current supplied from only a single hollow cathode, and the non-uniformity of the gas distribution due to that single cathode will be eliminated by using this multiple-aperture side hollow cathode technique. In plasma cleaning, or etching as in the case of RF sputtering or diode sputtering, it is desirable to inject electrons at a number of positions. This invention allows that process with a single device, rather than a number of devices which must be separately driven and tediously balanced. In other large scale plasma operations, such a magnetron sputtering, the scale-up to manufacturing requires large electron currents, greater than possible with a single hollow cathode. The multiple, side hollow cathode described here is a convenient solution to this problem, as well as providing increased uniformity of the plasma.

Additional cathode structures might include a circular or bent tube having a series of holes in one side to give the effect of multiple cathodes in the same plane as in a simple circular gas stove burner. Also a planar hollow cathode structure is envisioned which would comprise a flat hollow structure having a plurality of holes on one-one side thereof and having sheets of electron emissive foil inside together with suitable openings for sustaining ionizeable gas flow.

CONCLUSIONS

The present invention consists of the addition of two widely separated areas of technology. The magnetron and other plasma devices are conventionally used for the sputter etching/deposition of metals and other materials in the semiconductor industry. The hollow cathode originated in the space program and was proposed for use in ion engines for interplanetary spacecraft. The use of triodes for sputtering per se is not new, but no systematic work has been done on magnetron triode devices because of the enhancement already present due to the magnetic field. The addition of a point source of electrons to a magnetron, for example, was not tried before because of the non-uniform nature of the magnetic field, and the fact that electrons would be expected to form a small local plasma, if any, and have no beneficial effect on the more global magnetron device. The present invention has taken two broadly separated areas of technology and combined them together in a unique way to produce a significant, non-obvious development for the formation of intense, controllable plasmas.

While most of the description of the preferred embodiment of the present invention has been directed to magnetron plasma devices, it is to be understood that the hollow cathode enhancement concept would apply equally well to plasma sputter etching/deposition systems including magnetron, RF diode (DC), ion beam and also to ion plating systems. And further, the present concept allows the combining of two otherwise incompatible systems in a single process chamber.

Also, the ability to operate the device over a wide range of power levels allows etching of substrates in two different modes while altering only the power level of the process (in the magnetron plasma device).

Finally, the versatility of the present combined plasma sputter etching/deposition system suggested the need for hollow cathode structures capable of higher overall density electron beams distributed more evenly over larger areas in order to take advantage of the versatility of the overall system. Once the classical cylindrical symmetry was found to be unnecessary, a variety of designs are possible, including linear arrays of apertures, apertures on opposing sides of tubes, and ring-shaped or bent tubular arrays. Also, flat cathode structures having a plurality of holes in one surface for electron emission have been demonstrated.

Having thus described our invention, what we claim as new and desire to secure by Letters Patent is:

1. An etching/deposition system comprising a hollow cathode electron source in combination with a plasma sputter etching/deposition device within a containment chamber, said hollow cathode being disposed to inject electrons into the energy field of the plasma device adjacent to a workpiece to be processed by said system, means for initiating and maintaining a thermionic electron discharge plasma within the hollow cathode and for initiating and maintaining the device plasma, and means for introducing an ioniziable gas into said system.

2. An etching/deposition system as set forth in claim 1 wherein the plasma sputter etching/deposition device comprises a magnetron diode device wherein said hollow cathode is disposed to inject electrons into the device to intersect magnetic field lines which traverse the front of the workpiece.

3. An etching/deposition system as set forth in claim 2, including means for switching the current/voltage characteristics of the magnetron at a constant power level between a state where substantially zero hollow cathode current is flowing to produce a primarily anisotropic etch in the workpiece and a second state of the magnetron device whereby substantial hollow cathode current is flowing to produce a primarily isotropic etch in the workpiece.

4. An etching/deposition system comprising a hollow cathode electron source in combination with a magnetron plasma sputter etching/deposition device within a containment chamber, said hollow cathode being disposed to inject electrons to intersect the magnetic field lines which traverse the front of a workpiece to be processed by said system, means for initiating and maintaining a thermionic electron discharge plasma within the hollow cathode and for initiating and maintaining the plasma in the magnetron device, and means for introducing an ioniziable gas into said system.

5. An etching/deposition system comprising a hollow cathode electron source in combination with at least two different plasma sputter etching/deposition devices within a single containment chamber, said hollow cathode being disposed to inject electrons into the energy fields of the plasma devices adjacent to a workpiece to be processed by said system, means for initiating and maintaining a thermionic electron discharge plasma within the hollow cathode and for selectively initiating and maintaining the plasma within each of said plasma devices, and means for introducing an ioniziable gas into said system.

6. An etching/deposition system as set forth in claim 5 wherein one of said two plasma sputter etching/deposition devices comprises a magnetron device and the other comprises an RF plasma device.

7. An etching/deposition system as set forth in claim 5 wherein one of said two plasma sputter etching/deposition devices comprises a magnetron device and the other comprises an ion beam sputtering device.

8. An etching/deposition system as set forth in claim 5 wherein one of said at least two plasma sputter etching/deposition devices comprises a magnetron device and the other comprises a line-of-sight processing device utilizing electrons, ions or photons for effecting the etching/deposition process.

9. An etching/deposition system as set forth in claim 5 wherein one of said two plasma sputter etching/deposition devices comprises a magnetron device and the other comprises an evaporation device.

10. An etching/deposition system as set forth in claim 5 wherein one of said two plasma sputter etching/deposition devices comprises a magnetron device and the other comprises an ion plating process.

11. A hollow cathode structure adapted for use in a hollow cathode enhanced plasma sputter etching/deposition system which comprises a hollow tubular member constructed of a refractory metal, said tubular member being open at, at least one end thereof for the admission of an ioniziable gas, at least one hole in the side of said tube for the emission of ionized gas and electrons, and a plurality of layers of electron emissive foil within said hollow tubular structure adjacent to said hole which foil is heated to an electron emissive temperature by ion bombardment from said ioniziable gas when said gas is subjected to an ionizing voltage within said cathode.

12. A hollow cathode structure as set forth in claim 11, including a plurality of holes in the side of said tubular structure for the emission of ionized gas and electrons and there is a plurality of layers of said thermionic electron emissive foil adjacent to each of said holes and means for initiating an ionized gas plasma within said tubular member adjacent to each of said holes.

13. A hollow cathode structure as set forth in claim 12, wherein said means for initiating said ionized gas discharge comprises a single anode structure external to said hollow cathode member and adjacent to each of said holes.

14. A hollow cathode structure as set forth in claim 12 including a separate anode member adjacent to each of said holes in the cathode wall and means for selectively energizing an anode when it is desired that an electron stream be generated by the hole associated with that particular anode.

15. A hollow cathode structure adapted for use in a hollow cathode enhanced plasma sputter etching/deposition system which comprises a hollow member constructed of a refractory material, said member being open at one end thereof for the admission of an ioniziable gas, a plurality of holes in the same side of said member for the emission of ionized gas and electrons, and a plurality of layers of electron emissive foil within said hollow tubular structure adjacent to each of said holes, means for heating said foil to an electron emissive temperature by ion bombardment from said ioniziable gas by subjecting said gas to an ionizing voltage.

16. A hollow cathode structure as set forth in claim 15, wherein said hollow member comprises a tube bent into a generally circular configuration, and wherein said plurality of holes in the same side of said member for the emission of ionized gas and electrons from a circular array in a common plane which can produce an intense wide area electron stream for use in a plasma process.

17. An etching/deposition system comprising a hollow cathode electron source in combination with two different plasma sputter etching/deposition devices within a single containment chamber, said hollow cathode comprising a hollow tubular member constructed of a refractory metal, said tubular member being open at, at least one end thereof for the admission of an ioniziable gas, a plurality of holes in the side of said tubular member, at least one of said holes being located to optimally inject electrons into the energy field of a first plasma device and at least another hole being located to optimally inject electrons into the energy field of a second plasma device adjacent to a workpiece to be processed by said system, means for initiating and maintaining a thermionic electron discharge plasma within the hollow cathode and for selectively initiating and maintaining the plasma within each of said plasma devices, and means for introducing an ioniziable gas into said system.

* * * * *